(12) United States Patent
Todi et al.

(10) Patent No.: US 9,478,984 B2
(45) Date of Patent: Oct. 25, 2016

(54) ELECTRICALLY PROGRAMMABLE ELECTRONIC LOAD

(71) Applicant: Dialog Semiconductor B.V., 's-Hertogenbosch (NL)

(72) Inventors: Rahul Todi, Eindhoven (NL); Michele Ancis, Den Dungen (NL)

(73) Assignee: Dialog Semiconductor B.V., 's-Hertogenbosch (NL)

( * ) Notice: Subject to any disclaimer, the term of this patent is extended or adjusted under 35 U.S.C. 154(b) by 473 days.

(21) Appl. No.: 13/961,978

(22) Filed: Aug. 8, 2013

(65) Prior Publication Data

US 2014/0285012 A1    Sep. 25, 2014

(30) Foreign Application Priority Data

Mar. 19, 2013 (EP) .................................... 13159998

(51) Int. Cl.
- *H02J 1/10* (2006.01)
- *H03H 7/25* (2006.01)
- *H03H 11/24* (2006.01)

(52) U.S. Cl.
CPC ........ *H02J 1/10* (2013.01); *H03H 7/25* (2013.01); *H03H 11/24* (2013.01); *Y10T 307/406* (2015.04)

(58) Field of Classification Search
CPC ........... H02J 1/10; H03H 7/25; H03H 11/24; Y10T 307/406

USPC .......................................................... 307/31
See application file for complete search history.

(56) References Cited

U.S. PATENT DOCUMENTS

| 6,937,180 | B1* | 8/2005 | Muratov | ............ | H03M 1/0678 |
| | | | | | 341/144 |
| 2007/0085627 | A1 | 4/2007 | Kraemer | | |
| 2008/0088382 | A1 | 4/2008 | Ito | | |
| 2011/0057736 | A1* | 3/2011 | Badillo | ................ | H03K 3/0315 |
| | | | | | 331/57 |

OTHER PUBLICATIONS

European Search Report 13159998.7-1850 Mailed: Aug. 6, 2013, Dialog Semiconductor B.V.
"A Wideband Low Phase-Noise LC-VCO With Programmable Kvco," by Svetozar S. Broussev et al., IEEE Microwave and Wireless Components Letters, vol. 17, No. 1, Apr. 2007, pp. 274-276.

* cited by examiner

*Primary Examiner* — Hal Kaplan
(74) *Attorney, Agent, or Firm* — Saile Ackerman LLC; Stephen B. Ackerman

(57) ABSTRACT

An electrically programmable load having an impedance value dependent on a received control word. The electrically programmable load has several parallel load units. Each load unit has one or more load unit element who receive a control word component of the control word and have a load unit element impedance value which depends on a control word component value of the control word component, where the control word component value is one of three or more different biasing values.

14 Claims, 3 Drawing Sheets

ELECTRICALLY PROGRAMMABLE ELECTRONIC LOAD

TECHNICAL FIELD

The field of this invention is the realm of electrically programmable electronic loads.

BACKGROUND ART

Electrically programmable electronic load circuits provide specific load—that is the relationship between voltage and current values at a circuit's port—which can vary between a minimum and maximum values, according to a control signal pattern called the codeword.

FIG. 1 shows some fundamental quantities in a programmable electronic load L. FIG. 1 shows the electrically programmable load L with two terminals T1, T2 receiving a current I(s), which is associated with a voltage V(s) between the terminals T1, T2. The following relation can be defined:

$$Z(s)=V(s)/I(s)$$

Where Z(s)=impedance of an electrically programmable load L.

An essential feature of an electrically programmable load 1 is that the value of Z(s) depends on a codeword CW applied to the electronically programmable load L. The key points of electronically programmable loads are:

- the type of load (resistive, capacitive, inductive, separate or mixed)
- the range of load (minimum and maximum impedance values of the loads)
- the load step or resolution, i.e. the steps with which the load impedance can be varied by the codeword.

While the first point determines which type of load units have to be implemented, the latter two points jointly determine the number of load elements making-up the electronically programmable load.

FIG. 2 shows a prior art electronically programmable load, in the case of a parallel implementation, for which a Y representation (Y(s)=1/Z(s)=I(s)/V(s)) is more natural. A number N of parallel connected electronically programmable load units U(1), . . . , U(n), . . . , U(N), of a certain selected load type chosen is programmed such that each load unit assumes one of two possible values, a minimum value and a maximum value.

It is observed that, hereafter, sometimes reference is made to a load unit U, indicating anyone of these load units by U(n), n=1, 2, . . . N.

For a given load type and implementation choice of the load, the number:

$$\frac{Y_{U,max}}{Y_{U,min}} = \alpha \quad (1)$$

where $Y_{U,max}$=maximum admittance of a load unit U and $Y_{U,min}$=minimum admittance of load unit U, is fixed for each load unit U(n) and can therefore be used in all subsequent calculations for load step and load range, in the prior art.

The load units U(n) can be arranged and/or switched following two approaches.

Thermometric (or Unary Approach)

In the first approach (shown in FIG. 2), single load units U(n) are arranged in parallel and each load unit U(n) has a same admittance value. The lowest possible admittance value $Y_{min}$ of the total electronically programmable load is obtained by switching all individual load units U(n) to their minimum admittance value $Y_{U, min}$:

$$Y_{min}=N \cdot Y_{U,min} \quad (2)$$

Each of the load units U(n) must be switched to its maximum admittance value $Y_{U,max}$ one after the other, in sequence, in order to obtain a highest possible admittance value $Y_{max}$ of the total electronically programmable load is obtained:

$$Y_{max}=N \cdot Y_{U,max}=N \cdot \alpha \cdot Y_{U,min} \quad (3)$$

The load step $Y_{step}$ is:

$$Y_{step}=(\alpha-1) \cdot Y_{U,min} \quad (4)$$

and the number of steps is equal to that of the load units U(n) minus one, N−1.

Binary

In the binary approach, the load units U(n) arranged as shown in FIG. 2 are grouped in a plurality of groups following a base 2 exponential law, so that the first group has one load unit U(1), the second group has two load units U(2), U(3), etc. Or stated more generally, an n-th group has $2^{n-1}$ load units.

So, if there are N load units U(N) available there are $$K=\log_2(N+1) \quad (5)$$

such groups. And stated differently, N should have an integer value such that K is an integer. The individual load units U(n) of a single group are switched simultaneously such that each one of them has either an admittance value of $Y_{min}$ or $Y_{max}$. The switching of each group then follows a binary coding, i.e., each group of said K groups can be switched with applying either a low or high single logical signal which is then applied to each individual one of said load units U(n) in the group.

So, a code word CW can be used which is a string of K binary symbols whose position in the string uniquely identifies the referred unit group. As an example, if K=3 (3 groups), the binary code word CW=010 commands the first group to be switched to admittance value $Y_{min}$, the second group to admittance value $Y_{max}$, and the third group to admittance value $Y_{min}$ again. The synthesized load is thus:

$$Y_{010}=Y_{min}+2 \cdot Y_{max}+4 \cdot Y_{min} \quad (6)$$

and for a general code word CW, the following admittance value $Y_{CW}$ applies (bearing in mind that $Y_{max}/Y_{min}=\alpha$:

$$Y_{CW}=[2^K-1+(\alpha-1) \cdot CW] \cdot Y_{min} \quad (7)$$

$Y_{min}$, $Y_{max}$ can be expressed both in terms of N or K:

$$Y_{min}=N \cdot Y_{U,min}=(2^K-1) \cdot Y_{U,min} \quad (8)$$

$$Y_{max}=N \cdot Y_{U,max}=N \cdot \alpha \cdot Y_{U,min}=(2^K-1) \cdot \alpha \cdot Y_{U,min} \quad (9)$$

The load step is the same as in the thermometric arrangement:

$$Y_{step}=(\alpha-1) \cdot Y_{U,min} \quad (10)$$

The binary approach allows for a simplification step consisting in conceptually merging the load units U(n) belonging to one group together, synthesizing the k-th group with a single load unit having:

$$Y_k=2 \cdot Y_{k-1}=2^k \cdot Y_0. \quad (11)$$

However, this has implications for the quality of matching between units as a scaled $Y=N \cdot Y_1$ however implemented, will never be more accurate than its counterpart made of N equal $Y_1$ units tied together.

It is therefore sensible to reason in terms of effective units as explained above, also in the case of binary coding where scaling could be used to reduce the number of units, at the expense of a poorer matching between units.

The limit of the prior art is the relationship between the range of the implemented load units U(n) and the load step chosen.

Starting from a target load step, range, and implementation using eqns. (2-4) the number of units N required is given by:

$$N = \frac{Y_{max}}{\alpha \cdot Y_{U,min}} = \frac{\alpha-1}{\alpha} \cdot \frac{Y_{max}}{Y_{step}} \qquad (12)$$

We note also that if N grows too large (that is, the range grows and the step shrinks), it may happen that:

$$Y_{min} > N \cdot Y_{0,min} \qquad (13)$$

and the load cannot be realized with the desired characteristics and target implementation and technology.

Moreover, it is of general interest to reduce the number of units, N, as much as possible, since the interconnection between those is an element of non-ideality whose weight is directly proportional to N.

To conclude: the prior art implementing an electronically programmable load uses thermometric or binary weighted cells assuming one of two values (where in the thermometric approach, a cell comprises one load unit, and in the binary approach, the k-th cell has $2^{k-1}$ load units). In this implementation, the target load step and range identify uniquely the number of items needed through eqns. (2-5), with the constraint of eq. (12).

SUMMARY

The object of the invention is to solve at least one of the problems of the prior art mentioned above.

To that end, the present invention claims an electrically programmable load having an impedance value dependent on a received control word, the electrically programmable load comprising a plurality of parallel load units, each load unit comprising at least one load unit element, each load unit element being arranged to receive a control word component of said control word and having a load unit element impedance value which depends on a control word component value of said control word component, wherein said control word component value is one of three or more different biasing values.

Thus, with the invention, the relationship between load range, step, and number N of load units can be changed in such a way that, with respect to the prior art, a greater range, or a finer step can be achieved with the same number N of load units.

Advantageous embodiments are claimed in dependent claims.

DESCRIPTION OF THE DRAWINGS

The invention will be explained in detail with reference to some drawings that are only intended to show embodiments of the invention and not to limit the scope. The scope of the invention is defined in the annexed claims and by its technical equivalents. I.e., a person skilled in the art will understand that features, components, elements, etc. explicitly used to explain the invention can be substituted by technical equivalents unless otherwise stated.

The drawings show.

DESCRIPTION OF A PREFERRED EMBODIMENT

Figure 1:
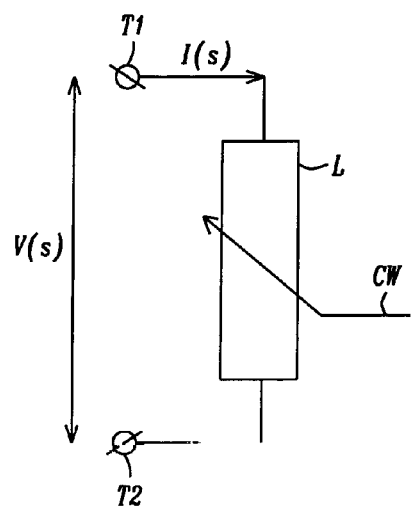
FIG. 1 is an example of a load unit whose impedance value depends on a control signal.
Figure 2:
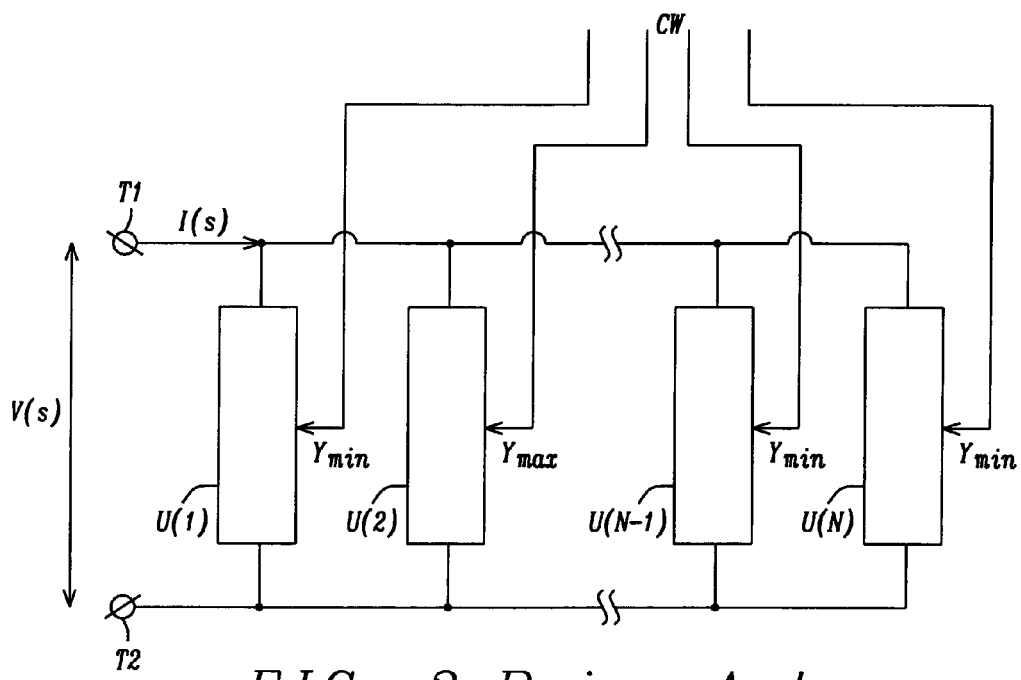
FIG. 2 is an example of a prior art circuit with programmable load units.
Figure 3:
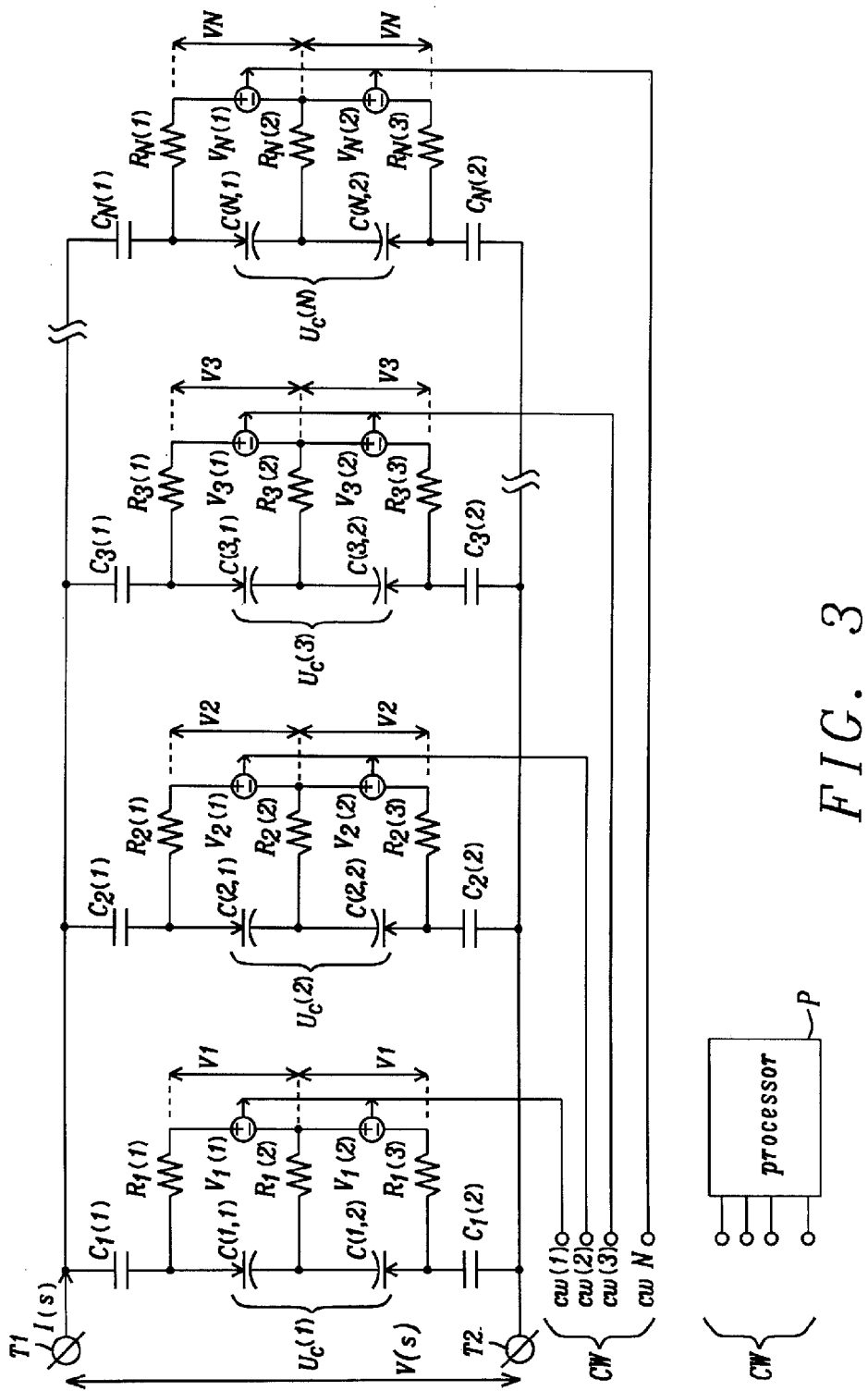
FIG. 3 is an example of a circuit with programmable load units according to the invention.

FIG. 3 shows an embodiment of the invention in the case of a programmable capacitive load. In this, the parallel connected load units are voltage dependent capacitors, i.e. units whose small signal (AC) capacitance value is dependent on the DC voltage applied between the terminals of the unit.

FIG. 3 shows a plurality of N load units $U_c(1), \ldots, U_c(n), \ldots, U_c(N)$. Each one of these load units $U_c(1), \ldots, U_c(n), \ldots, U_c(N)$ comprises two voltage dependent capacitors, denoted as $C(n,1)$, $C(n,2)$ for $n=1, 2, \ldots, N$. These two voltage dependent capacitors $C(n,1)$, $C(n,2)$ in one load unit may be implemented as semiconductor diode elements which are oppositely connected as shown in FIG. 3.

Each series connection of two capacitors $C(n,1)$, $C(n,2)$ is connected to input voltage V(s) via respective coupling capacitors $C_n(1)$ and $C_n(2)$, $n=1, 2, \ldots, N$. In an embodiment, these respective coupling capacitors $C_n(1)$ and $C_n(2)$ have an impedance value which is negligible small relative to the impedance value of the voltage dependent capacitors $C(n,1)$, $C(n,2)$ at the working frequency of the circuit, say at least 10 times smaller, but preferably 100 times smaller. However, the invention is not restricted to such an embodiment since also other values are not in conflict with the working principle. Coupling capacitor $C_n(1)$ is connected to voltage dependent capacitor $C(n,1)$ and coupling capacitor $C_n(2)$ is connected to voltage dependent capacitors $C(n, 2)$.

Each voltage dependent capacitor $C(n,1)$, $C(n,2)$, respectively, is biased by a biasing voltage Vn, applied by a voltage source $V_n(1)$, $V_n(2)$, respectively, via suitable resistors $R_n(1)$, $R_n(2)$, $R_n(3)$. I.e., resistor $R_n(1)$ has one side connected to the junction between voltage dependent capacitor $C(n,1)$ and coupling capacitor $C_n(1)$ and its other side to one side of voltage source $V_n(1)$, resistor $R_n(2)$ has one side connected to the junction between voltage dependent capacitor $C(n,1)$ and voltage dependent capacitor $C(n,2)$ and its other side to one side of voltage source $V_n(2)$ which is also connected to the other side of voltage source $V_n(1)$, whereas resistor $R_n(3)$ has one side connected to the junction between voltage dependent capacitor $C(n,2)$ and coupling capacitor $C_n(2)$ and its other side to the other side of voltage source $V_n(2)$.

A control word CW comprises N control word components $cw(1), cw(2), \ldots, cw(n), \ldots, cw(N)$. control word component $cw(n)$ is applied to two voltage sources $V_n(1)$, $V_n(2)$ both generating biasing voltage Vn in dependence on the value of control word component $cw(n)$. It is observed that, here, the term "control word" is used, like in the prior art. However, whereas in the prior art the term "word" means that each one of its components can take one of two different values (like in computer technology), it is emphasized that, here, each one of its components can have one of three or more different values.

In the embodiment shown in FIG. 3, the control word components cw(n) are generated by a processor P which is arranged such that they can take either one of three different values such that each one of the biasing voltages Vn can be set to one of three different voltages $V_A$, $V_B$, $V_C$, respectively. Any voltage source able to do so may be suitable. In the embodiment shown in FIG. 3, e.g., this may be implemented such that $V_A$=VDD $$V_B = 0 \text{ V}$$

$$V_C = -VDD$$

where VDD is a predetermined voltage.

However, instead of the arrangement with voltage sources $V_n(1)$, $V_n(2)$ other arrangements may be used. For instance, a simple implementation would be a resistor string with switches tapping in three different places, thus providing three possible voltage levels. Another implementation uses only two absolute voltages, i.e., a ground voltage V0 and a supply voltage Vs, taking advantage of the symmetry of the structure, and feeding with reference to FIG. 3:

$V_A$: providing ground level to the right side of resistors $R_n(1)$ and $R_n(3)$ and providing supply voltage Vs to the right side of resistor $R_n(2)$;

$V_B$: providing ground level to the right side of all three resistors $R_n(2)$, $R_n(2)$ and $R_n(3)$ $V_C$: providing ground level to the right side of resistor $R_n(2)$ and providing supply voltage Vs to the right side of resistors $R_n(2)$ and $R_n(3)$ Each one of the voltage dependent capacitors C(n,1), C(n,2) is arranged to have a capacitor value $C_{min}$, $C_{mid}$, or $C_{max}$, respectively, if it receives a biasing voltage Vn of $V_A$, $V_B$, or $V_C$, respectively.

The load units, i.e. all voltage dependent capacitors C(n,1), C(n,2), are all equal in this embodiment for the purpose of showing the working principle, but they don't need to be if, for instance, a nonlinear dependency is to be achieved, nor need there be three voltages, there can be more than three.

This embodiment is symmetric, thus each capacitive load unit $U_c(n)$ consists of two identical sub-units C(n,1), C(n,2) biased at the same voltage Vn, as can be seen in FIG. 3. Consequently, each capacitive load unit $U_c(n)$ can have one of three different capacitor values $C_{U,min}$, $C_{U,mid}$, $C_{U,max}$, depending on the control voltage Vn. This gives a total of $3^N$ values generated by the combination of N ternary values, as opposed to $2^N$ values given by the prior art. Some of these combinations are equivalent, however, so that the total number of code words CW giving different load values is:

$$\text{Combinations} = \frac{(N+3-1)!}{N!(3-1)!} \quad (14)$$

We now choose the intermediate biasing voltage $V_B$ such that:

$$\frac{C_{U,mid}}{C_{U,min}} = \beta = \frac{C_{U,max}}{3 \cdot C_{U,min}} = \frac{\alpha}{3} \quad (15)$$

to fix ideas, however the choice of $V_B$ is arbitrary. So, in general terms $\beta = \alpha/p$, where p is a real number larger than 1

With the choice of p=3, the load step $C_{step}$, i.e. the smallest capacitor value change of the total circuit shown in FIG. 3, becomes:

$$C_{step} = C_{U,mid} - C_{U,min} = (\beta - 1) \cdot C_{U,min} \quad (16)$$

The maximum load capacitance $C_{max}$, i.e. the maximum capacitor value of the total circuit of FIG. 3, is:

$$C_{max} = N \cdot \alpha \cdot C_{U,min} \quad (17)$$

and the minimum load capacitance $C_{T\,min}$, i.e. the minimum capacitor value of the total circuit of FIG. 3, is:

$$C_{T\,min} = N \cdot C_{n_{min}} \quad (18)$$

To compare this embodiment with the one of the prior art, let's now refer to a same target $C_{step}$, $C_{T,min}$, $C_{T,max}$, where "T" refers to the total circuit, and same technology and implementation, so that $\alpha$ is equal between prior art and the proposed invention. We call N the number of load units given by (5), again reported here where the generic Y has been substituted with a capacitance C:

$$N = \frac{C_{max}}{\alpha \cdot C_{U,min}} = \frac{\alpha - 1}{\alpha} \cdot \frac{C_{max}}{C_{step}} \quad (19)$$

Note that in equation (19) all parameters refer to the prior art. In the following equation all parameters without a prime refer to the prior art, be it that the target is that in both technologies $C_{step}$, $C_{T,min}$, $C_{T,max}$ are the same.

Now, we define N', $C_{min}'$ as the number of load units $U_c(n)$ and minimum unit capacitance given by the proposed invention, respectively.

$$C'_{min} = \frac{C_{step}}{\beta - 1}; C_{U,min} = \frac{C_{step}}{\alpha - 1} = \frac{\beta - 1}{\alpha - 1} \cdot C'_{min} \quad (20)$$

which shows how the prior art imposes a smaller unit capacitance for the same target load step. We now express the target $C_{T,max}$ for both cases:

$$C_{T\,max} = N \cdot \alpha \cdot C_{0,min} = N \cdot \alpha \cdot \frac{\beta - 1}{\alpha - 1} \cdot C'_{min} = N' \cdot \alpha \cdot C'_{min} \quad (21)$$

and the achieved $C_{T\,min}$:

$$C_{T\,min} = N \cdot C_{0,min} = N \cdot \frac{\beta - 1}{\alpha - 1} \cdot C'_{min} = N' \cdot C'_{min} \quad (22)$$

therefore:

$$N' = N \cdot \frac{\beta - 1}{\alpha - 1} \quad (23)$$

As an example, let's put $\alpha=4$, $\beta=\alpha/3$ to get:

$$N' = N \cdot \frac{\frac{\alpha}{3} - 1}{\alpha - 1} = \frac{N}{9} \quad (24)$$

which proves how the proposed invention provides a lower number N' of needed units for a same load step and range. It is therefore also automatically proven that using the same number of units as the prior art, a greater range can be achieved with the same load step, or the same range can be synthesized with a finer load step.

Generalizations

The proposed invention has been shown for a capacitor network of N capacitor units $U_c(N)$ in parallel. However, the principle can be extended:
- to any type of load (R,L,C) and combinations thereof
- to series and/or parallel combinations of the above
- to switching of the units to more than three values
- to non-constant switching of the units which may be useful for realization of non linear dependencies.

Figure 4:
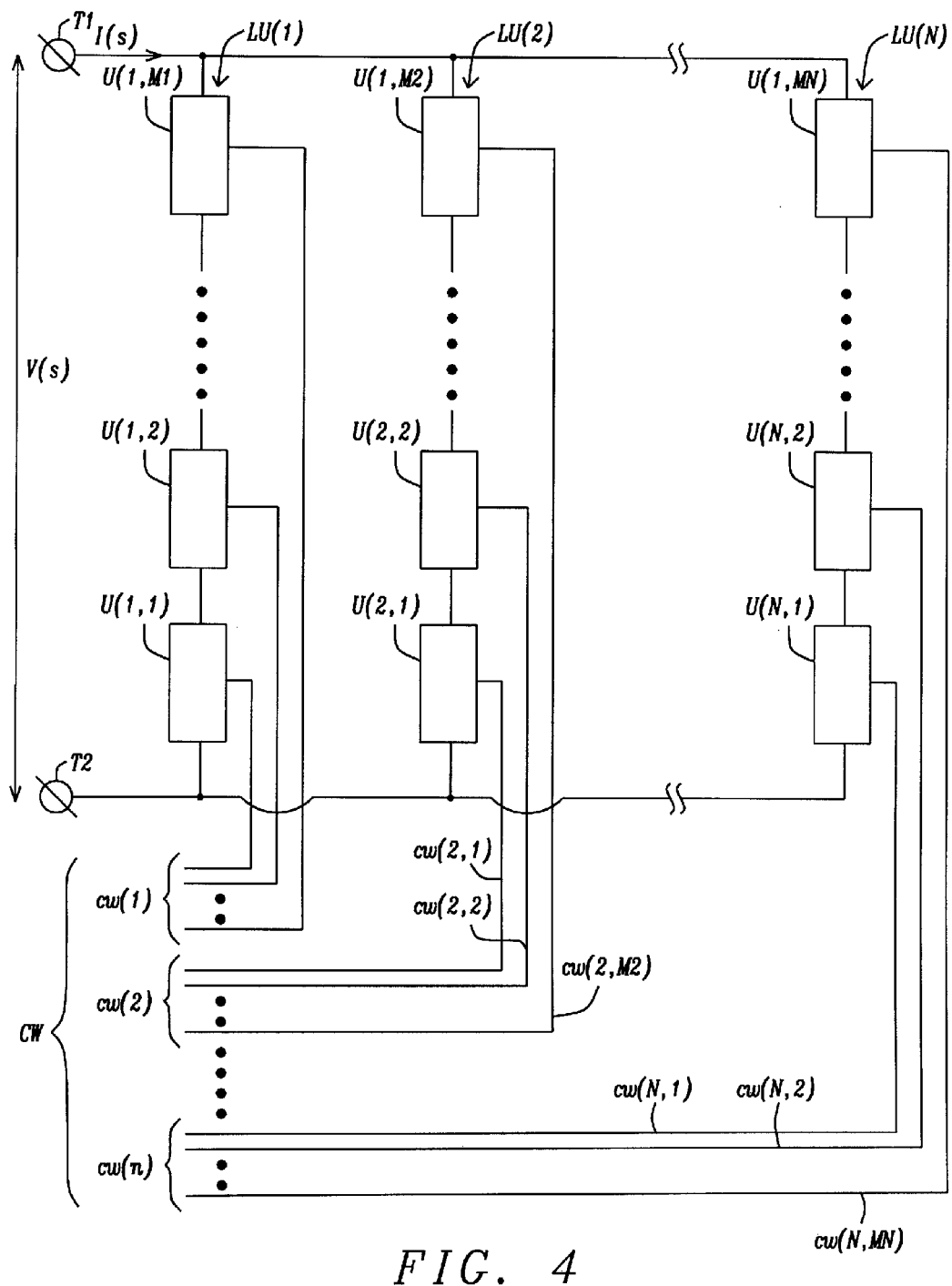
FIG. 4 is a generalized overview of a circuit according to the invention.

In general terms, the load according to the invention can be implemented as shown in FIG. 4. The load comprises N parallel branches having one of the load units LU(1), LU(2), . . . , LU(n), . . . . , LU(N). Each load unit LU(n) comprises a series connection of load unit elements U(n,1), U(n, 2), . . . , U(n,$m_n$), . . . , U(n,$M_n$). Each load unit element U(n,$m_n$) receives a control word component cw(n,$m_n$) as produced by processor P. Each one of the control word component cw(n,$m_n$) can have one of three or more values. Such latter values can either be a voltage or a current. Moreover, such a load can, of course, be combined with a prior art load, if desired. A voltage dependent resistor can be implemented with a MOS transistor in triode, with the value of the resistance controlled by the gate to source voltage. There are other arrangements of course. A voltage dependent inductor could be implemented by means of a so-called Antoniou impedance, a realization of a negative impedance converter. It is an OpAmp based circuit so it is not suitable for high frequencies.

To summarize, the following advantages can be obtained, with the present invention.
- The relationship between load range, step, and number N of units is changed in such a way that, with respect to the prior art,
  a) a greater range, or
  b) a finer step
  can be achieved with the same number N of units.
- It is possible to implement a varying load step as may be needed for rendering a linear vs. codeword relationship for another parameter. I.e., in general one wishes that the load is a linear function of the codeword, that is load=const*codeword. This is another way of saying that the load step is constant. However, in an embodiment the relationship between load and codeword is altered such as to make some other parameter linear vs. codeword. One example is the resonance frequency of an RLC parallel circuit. Then, the frequency is proportional to 1/(sqrt(LC)). If we change C linearly with the codeword, the frequency Vs. codeword will be for sure non-linear. However, the invention as explained above may be implemented such that the relationship between the capacitor value C and codeword is non-linear such that the function "frequency Vs. codeword" becomes linear.
- One could also implement a circuit such that a parameter has a value which is non-linearly related to the load value. For example a VCO (voltage controlled oscillator) tuning frequency $f_{VCO}$, whose dependency on the programmable capacitance value C is $f_{VCO} \propto 1/\sqrt{C}$ from which it is apparent that a linear dependence of the programmable capacitance C on the code word would lead to a non-linear dependence of the VCO frequency $f_{VCO}$ on the same code word.

It is to be understood that the invention is limited by the annexed claims and its technical equivalents only. In this document and in its claims, the verb "to comprise" and its conjugations are used in their non-limiting sense to mean that items following the word are included, without excluding items not specifically mentioned. In addition, reference to an element by the indefinite article "a" or "an" does not exclude the possibility that more than one of the element is present, unless the context clearly requires that there be one and only one of the elements. The indefinite article "a" or "an" thus usually means "at least one".

The invention claimed is:

1. An electrically programmable load having an impedance value dependent on a received control word, the electrically programmable load comprising a plurality of parallel load units, each load unit comprising at least one load unit element, each load unit element being arranged to receive a control word component of said control word and having a load unit element impedance value which depends on a control word component value of said control word component, wherein said control word component value is one of three or more different biasing values.

2. The electrically programmable load according to claim 1, wherein at least one load unit comprises two or more load unit elements.

3. The electrically programmable load according to claim 1, wherein said control word component value is one of three different biasing values, each load unit element having a maximum admittance of $Y_{U,max}$ for a first one of said three different biasing values, an intermediate admittance of $Y_{U,min}$ for a second one of said three different biasing values, or a minimum admittance of $Y_{U,min}$, for a third one of said three different biasing values, and the following relation holds:

$$Y_{U,max} = \alpha Y_{U,min}$$

$$Y_{U,mid} = \beta Y_{U,min}$$

$\beta = \alpha/p$, where p is a real number larger than 1.

4. The electrically programmable load according to claim 1, wherein each of said each load unit elements comprises two voltage dependent capacitors.

5. The electrically programmable load according to claim 1, wherein the impedance value is a linear function of the control word.

6. The electrically programmable load according to claim 1, wherein the impedance value is a non-linear function of the control word such that another circuit parameter has a linear relationship with said control word.

7. The electrically programmable load according to claim 1, wherein a processor is connected to load unit elements, arranged to generate a control word and to provide said control word component of said control word to said load unit elements.

8. A method of operating an electrically programmable load having an impedance value dependent on a received control word, the electrically programmable load comprising a plurality of parallel load units, each load unit comprising at least one load unit element having a load unit element impedance value which depends on a control word component value of a respective control word component, the method comprising the steps of:
providing said respective control word component to each load unit element, said control word component value being one of three or more different biasing values.

9. The method of operating an electrically programmable load according to claim 8, wherein at least one load unit comprises two or more load unit elements.

10. The method of operating an electrically programmable load according to claim 8, wherein said control word component value is one of three different biasing values, each load unit element having a maximum admittance of $Y_{U,max}$ for a first one of said three different biasing values, an intermediate admittance of $Y_{U,mid}$ for a second one of said three different biasing values, or a minimum admittance of $Y_{U,min}$ for a third one of said three different biasing values, and the method comprises generating said three different biasing values such that the following relation holds:

$$Y_{U,max} = \alpha Y_{U,min}$$

$$Y_{U,mid} = \beta Y_{U,min}$$

$\beta = \alpha/p$, where p is a real number larger than 1.

11. The method of operating an electrically programmable load according to claim 8, wherein each of said each load unit elements comprises two voltage dependent capacitors.

12. The method of operating an electrically programmable load according to claim 8, wherein the impedance value is a linear function of the control word.

13. The method of operating an electrically programmable load according to claim 8, wherein the impedance value is a non-linear function of the control word such that another circuit parameter has a linear relationship with said control word.

14. The method according to claim 8, further comprising the steps of:
providing an electrically programmable load and,
providing a processor connected to load unit elements, arranged to generate a control word and to provide said control word component of said control word to said load unit elements.

* * * * *